(12) United States Patent
Balch et al.

(10) Patent No.: US 7,803,644 B2
(45) Date of Patent: Sep. 28, 2010

(54) ACROSS RETICLE VARIATION MODELING AND RELATED RETICLE

(75) Inventors: Bruce W. Balch, Saranac, NY (US); Jeanne P. Bickford, Essex Junction, VT (US); Nazmul Habib, South Burlington, VT (US); Phung T. Nguyen, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 507 days.

(21) Appl. No.: 11/853,976

(22) Filed: Sep. 12, 2007

(65) Prior Publication Data

US 2009/0068772 A1 Mar. 12, 2009

(51) Int. Cl.
*H01L 21/00* (2006.01)
(52) U.S. Cl. .............................. 438/18; 438/17; 438/14
(58) Field of Classification Search .................... 438/18, 438/17, 14
See application file for complete search history.

(56) References Cited

U.S. PATENT DOCUMENTS

| 7,273,685 | B2 * | 9/2007 | Sasazawa et al. | 430/30 |
| 7,383,521 | B2 * | 6/2008 | Smith et al. | 716/6 |
| 7,444,615 | B2 * | 10/2008 | Percin et al. | 716/19 |
| 2005/0132306 | A1 * | 6/2005 | Smith et al. | 716/1 |
| 2006/0183040 | A1 * | 8/2006 | Sasazawa et al. | 430/30 |
| 2006/0266243 | A1 * | 11/2006 | Percin et al. | 101/484 |
| 2009/0031261 | A1 * | 1/2009 | Smith et al. | 716/2 |
| 2009/0068772 | A1 * | 3/2009 | Balch et al. | 438/18 |
| 2010/0005442 | A1 * | 1/2010 | Ghinovker et al. | 716/21 |

* cited by examiner

*Primary Examiner*—Laura M Menz
(74) *Attorney, Agent, or Firm*—Ryan K. Simmons; Hoffman Warnick LLC

(57) ABSTRACT

Methods of modeling across reticle variations and a related reticle are disclosed. One embodiment of the method includes defining a test for determination across a multiple chip wafer; identifying a measurement structure for performing the test; implementing the measurement structure on the multiple chip wafer using a reticle including the measurement structure between copies of the multiple chips on the reticle, wherein no one of the multiple chips covers an entirety of the reticle; performing the test on the multiple chip wafer using the measurement structure to acquire data across the reticle; using data from the performing to establish an across reticle variation model; and using the across reticle variation model to predict across chip variation for at least one of the multiple chips.

4 Claims, 3 Drawing Sheets

_US 7,803,644 B2_

ACROSS RETICLE VARIATION MODELING AND RELATED RETICLE

BACKGROUND

1. Technical Field

The disclosure relates generally to integrated circuit (IC) chip fabrication, and more particularly, to modeling of an IC chip relative to across reticle variation and a related reticle.

2. Background Art

In the integrated circuit (IC) chip fabrication industry, accurate modeling of across chip parametric variation is critical to producing products that function as intended. As the geometries used in technologies shrink and products use lower voltages to conserve power, across chip variation has become an increasing part of total variation and the within chip impact of particular parameters on timing (set up and hold) determines whether a product will function as intended or not. IC products timed with accurate across chip variation models will work in customer applications. Parametric variations are created across a wafer during fabrication. Model-to-hardware correlations are generated by modeling based on data from a scribe line test structure placed in a scribe line of a reticle used to form IC chips on a wafer. This modeling is referred to as across chip variation (ACV) modeling. Current modeling approaches use information from one scribe line (kerf) test structure on a reticle. For example, FIG. 1 shows a reticle (mask) 10 used to generate one or more IC chips 12A-D. Reticle 10 may include one or more copies of each IC chip 12A-D thereon, and includes one scribe line test structure 14 in an outermost scribe line 16 of reticle 10. (Reticle 10 may represent, for example, a 30 mm by 30 mm field). Structure 14 is used mostly for mask overlay alignment, but may also include circuitry for defect monitoring (e.g., via opens) and parametric measurements. Unfortunately, variation is known to exist across the exposure field of reticle 10. As a result, data is not collected on a variety of across reticle parametric variations. For example, data may not be collected across the reticle's exposure field relative to variations for channel length, width, saturation threshold voltage (Vtsat), rapid thermal anneal (RTA), delay, resistance, or scribe line print and etch variation. As a result, across reticle variation is not considered during the fabrication process and IC chip qualification at a device level. Further, across reticle variation is not measured in the manufacturing line, so consideration of the impact of process changes on across reticle variations and the provision of in-line corrections is prohibited. The first time a across reticle variation causing a failure is identified is after the finished IC chip fails a test.

SUMMARY

Methods of modeling across reticle variations and a related reticle are disclosed. One embodiment of the methods includes defining a test for determination across a multiple chip wafer; identifying a measurement structure for performing the test; implementing the measurement structure on the multiple chip wafer using a reticle including the measurement structure between copies of the multiple chips on the reticle, wherein no one of the multiple chip copies covers an entirety of the reticle; performing the test on the multiple chip wafer using the measurement structure to acquire data across the reticle; using data from the performing to establish an across reticle variation model; and using the across reticle variation model to predict across chip variation for at least one of the multiple chips.

A first aspect of the disclosure provides a method comprising: defining a test for determination across a multiple chip wafer; identifying a measurement structure for performing the test; implementing the measurement structure on the multiple chip wafer using a reticle including the measurement structure between copies of the multiple chips on the reticle, wherein no one of the multiple chip copies covers an entirety of the reticle; performing the test on the multiple chip wafer using the measurement structure to acquire data across the reticle; using data from the performing to establish an across reticle variation model; and using the across reticle variation model to predict across chip variation for at least one of the multiple chips.

A second aspect of the disclosure provides a reticle for fabricating a multiple chip wafer, the reticle comprising: a plurality of measurement structures positioned within a number of scribe lines between copies of the multiple chips on the reticle.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
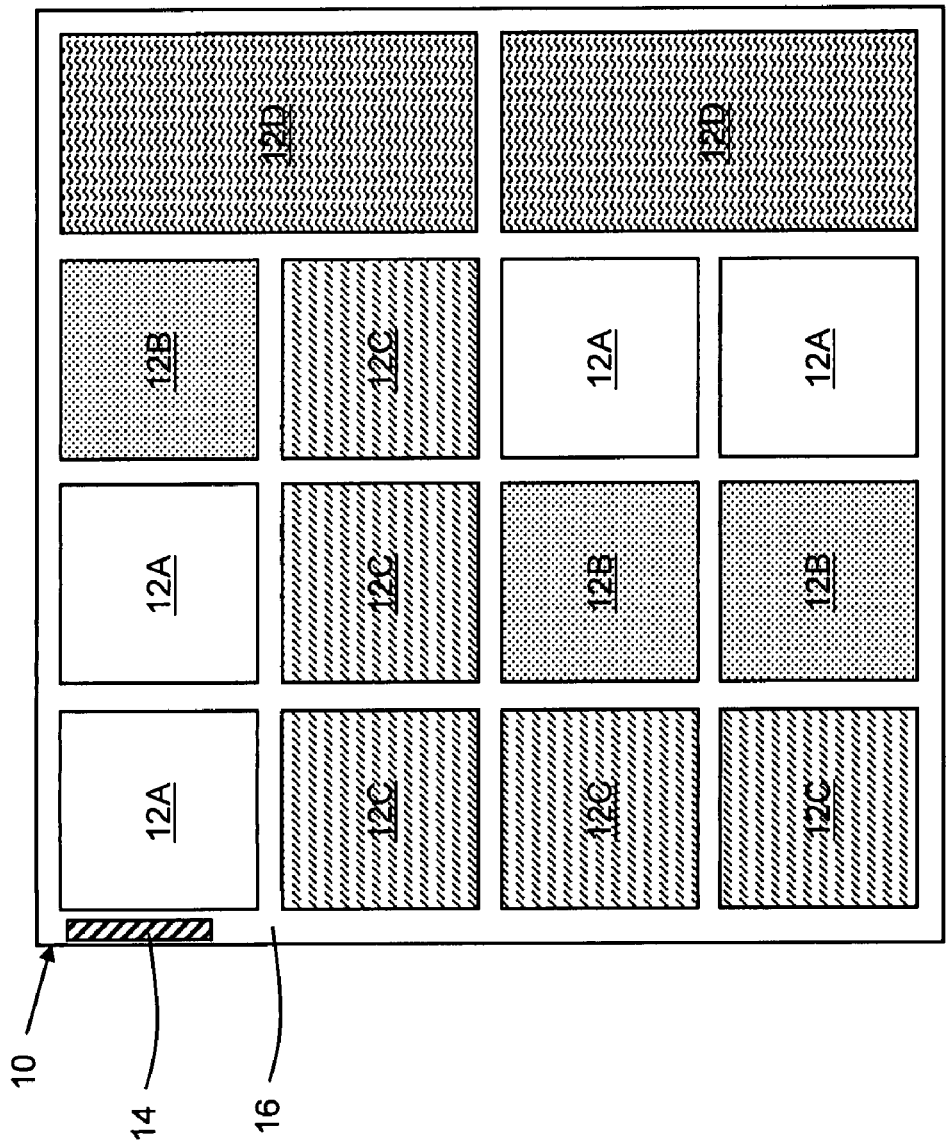
FIG. 1 shows a conventional reticle for fabrication a multiple chip wafer.
Figure 2:
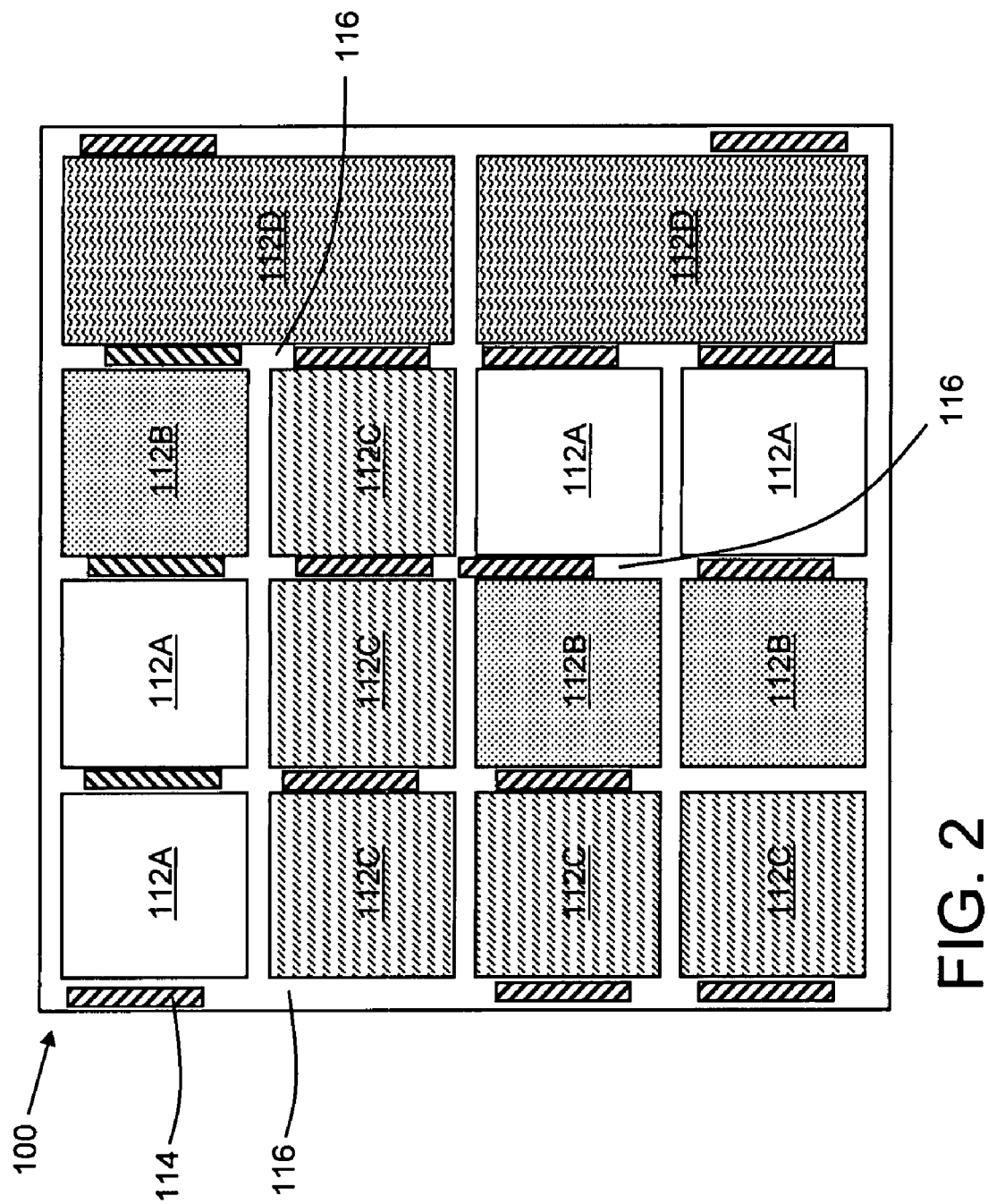
FIG. 2 shows a reticle for fabricating a multiple chip wafer according to one embodiment of the disclosure.

FIG. 2 shows a reticle 100 for fabricating a multiple chip wafer 140 (FIG. 3) according to one embodiment of the disclosure. Reticle 100 includes a plurality of measurement structures 114 positioned within a number of scribe lines 116 between copies 112A-D of multiple chips on the reticle. No one of multiple chip copies 112A-D covers an entirety of reticle 100. Each measurement structure 114 forms a test structure 142 on multiple chip wafer 140 (FIG. 3) for determining an across reticle variation, as will be described in greater detail herein.

Figure 3:
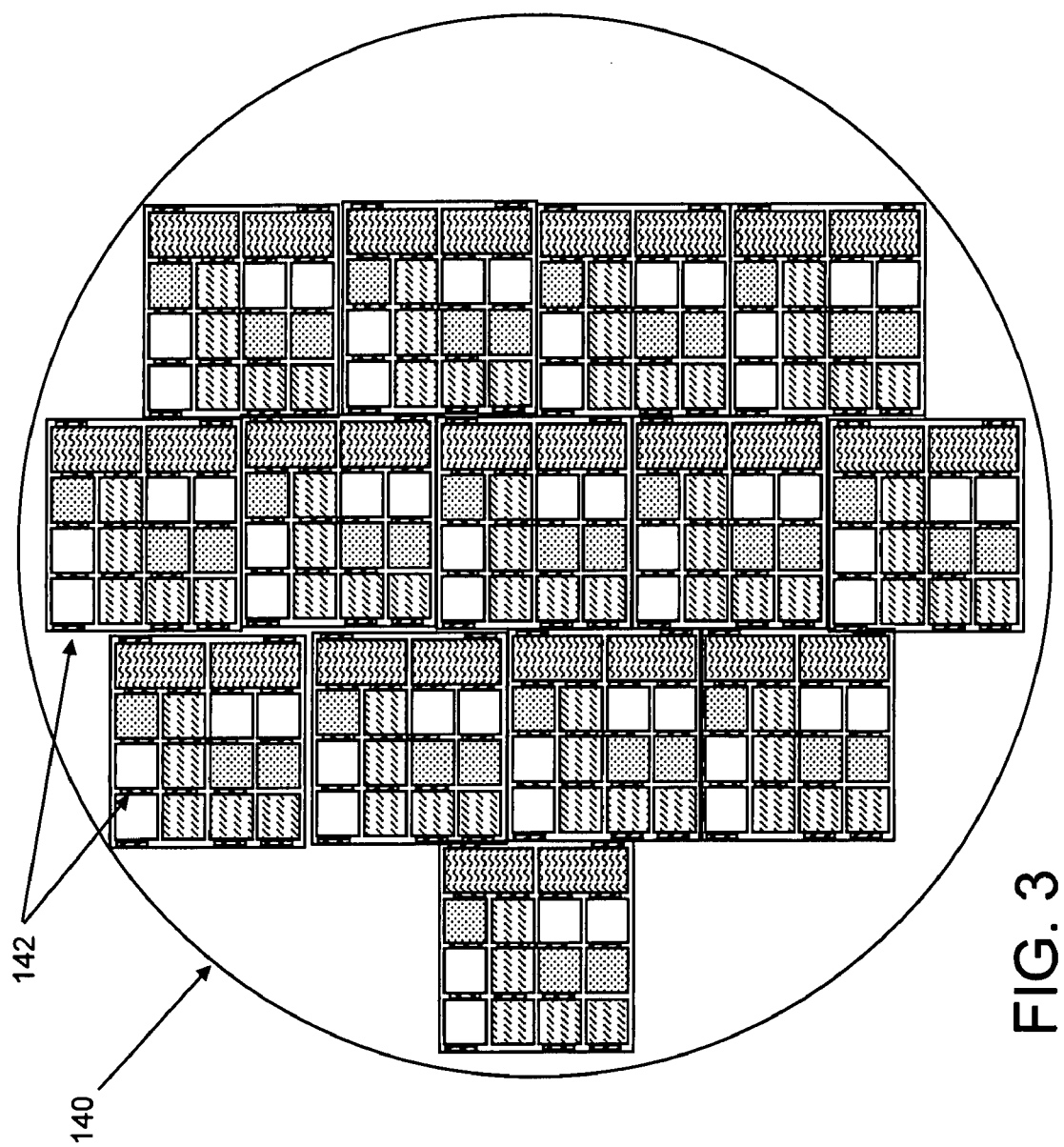
FIG. 3 shows a wafer including a plurality of copies of the reticle.

Referring to FIGS. 2 and 3, one embodiment of a method according to the disclosure will now be described. In a first process, a test for determination (i.e., running) across a multiple chip wafer 140 (FIG. 3) is defined. (Note, FIG. 3 is obviously not to scale and does not include as many prints of reticle 100 as would be expected). The test can be any now known or later developed test that may be useful to a fabricator, and can be customized. For example, the test may include channel length, width, saturation threshold voltage (Vtsat), rapid thermal anneal (RTA) variation, resistance and/or delay offset, etc. The test can be for defect determination or parametric measurement.

A measurement structure 114 (FIG. 2) may then be identified for performing the test. Measurement structures 114 may also be extended to include defect monitors. This process is within the purview one with ordinary skill in the art. Measurement structure 114 is implemented (generated) on multiple chip wafer 140 using reticle 100 including measurement structure 114 between copies of multiple chips 112A-D on the reticle. Again, no one of multiple chip copy 112A-D covers an entirety of reticle 100. A particular measurement structure 114 may be selectively positioned to obtain the desired data for a particular chip copy 112A-112D.

Once measurement structure 114 has been implemented, the test can be performed on multiple chip wafer 140 using the measurement structure (and any necessary supporting software). Multiple chip wafer 140 includes a number of images 142 from reticle 100. This process can occur after completion of an IC chip or can occur during manufacturing via in-line probing. That is, the test can be used in-line during manufacturing such that adjustments may be made contemporaneously.

The data obtained from the test's performing can be used in a number of ways. Most notably, the data can be used to establish an across reticle variation model. The modeling can be generated using any now known or later developed solution, e.g., scaling parametric monitor structures, traditional scribe line structures, or macros in pad cages. The across reticle variation model may be used in a number of ways. For example, the model may be used to predict across chip variation for at least one of the multiple chips, i.e., for a chip that does not cover the entire reticle. Measurements can be taken using a prober in manual mode or in an automatic test mode (by inserting alignment marks in each of the scribe line structures and setting up a step plan to allow the prober to automatically locate each structure). The model may also be used to form a specification for across reticle variation for a manufacturing line. The model thus can be used to ensure the manufacturing line remains within the specification and for manufacturing line learning. The model may also be embedded in conventional across chip variation estimation software.

The circuit (measurement structure) as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:
defining a test for determination across a multiple chip wafer;
identifying a plurality of measurement structures for performing the test;
implementing the plurality of measurement structures on the multiple chip wafer using a reticle, wherein the reticle includes a series of parallel scribe lines each parallel scribe line having at least three measurement structures positioned within each parallel scribe line, and wherein no one of the multiple chip copies covers an entirety of the reticle;
performing the test on the multiple chip wafer using the plurality of measurement structures to acquire data across the reticle;
using data from the performing to establish an across reticle variation model; and
using the across reticle variation model to predict across chip variation for at least one of the multiple chips.

2. The method of claim 1, wherein the identifying includes identifying the plurality of measurement structures for at least one of a parametric variation and a defect.

3. The method of claim 1, wherein the test includes at least one of the following tests: channel length, width, saturation threshold voltage (Vtsat), rapid thermal anneal (RTA) variation, resistance and delay offset.

4. The method of claim 1, further comprising using the plurality of measurement structures in-line during manufacturing.

* * * * *